United States Patent
Hsu

(10) Patent No.: US 6,238,220 B1
(45) Date of Patent: May 29, 2001

(54) COMMUNICATION MAIN LAYOUT RACK STRUCTURE

(75) Inventor: Pey-Son Hsu, Changhua Hsien (TW)

(73) Assignee: Ching Feng Blinds Ind. Co., Ltd., Changhua Hsien (TW)

( * ) Notice: Subject to any disclaimer, the term of this patent is extended or adjusted under 35 U.S.C. 154(b) by 0 days.

(21) Appl. No.: 09/620,070

(22) Filed: Jul. 20, 2000

(51) Int. Cl.⁷ .................................................. H01R 12/00
(52) U.S. Cl. ................................................ 439/75; 439/45
(58) Field of Search .................................. 439/43, 45, 48, 439/50, 61, 65, 67, 74, 75, 78, 83

(56) References Cited

U.S. PATENT DOCUMENTS

| | | | |
|---|---|---|---|
| 3,175,179 | * 3/1965 | Trump | 439/43 |
| 4,778,393 | * 10/1988 | Hosogai et al. | 439/45 |
| 5,598,627 | * 2/1997 | Saka et al. | 439/67 |
| 6,139,360 | * 10/2000 | Hayashi et al. | 439/65 |

* cited by examiner

*Primary Examiner*—Tho D. Ta
(74) *Attorney, Agent, or Firm*—Bacon & Thomas, PLLC

(57) ABSTRACT

A communication main layout rack structure includes a first PC board, a second PC board, several insertion seats, several pairs of insertion pins, several bus lines, several mating insertion seat, and several connectors. A central portion of the first PC board is formed with multiple copper-plated insertion holes arranged in a square pattern, while upper and lower sections of the one side edge of the first PC board are respectively formed with an insertion seat soldering section. Similarly, a central portion of the second PC board is formed with multiple copper-plated insertion holes arranged in a square pattern, while front and rear sections of an upper side edge of the second PC board are respective formed with an insertion seat soldering section, the insertion seats being soldered to the insertion seat soldering sections of the front faces of the first and second PC boards, and the mating insertion seats being respectively connected with one end of the bus lines and inserted into the insertion seats. The connectors are connected with the other end of the bus lines, with the connectors connected with one of the PC boards being inserted into an exchange and the connectors connected with the other of the PC boards being connected with telephones to form a main layout rack with small volume.

6 Claims, 5 Drawing Sheets

COMMUNICATION MAIN LAYOUT RACK STRUCTURE

BACKGROUND OF THE INVENTION

The present invention relates to a main layout rack structure for communication exchange, and more particularly to a layout rack structure including two cooperative PC boards to reduce the volume of the rack and provide connections for more telephones. Also, the rack structure simplifies telephone line connections.

The existing main layout rack structure used in a telephone exchange is composed of several terminal boards 10 sequentially overlaid on each other as shown in FIG. 1. The upper side of the terminal board 10 is formed with ten pairs of incoming line engaging troughs 11. The lower side of the terminal board 10 is formed with ten pairs of opposite outgoing line engaging troughs 12. The incoming line engaging troughs 11 serve to engage with lines connected to the exchange, while the outgoing line engaging troughs 12 serve to engage with the lines connected to the telephones. Each telephone corresponds to a pair of incoming line engaging troughs 11 and a pair of outgoing line engaging troughs 12. Therefore, each terminal board 10 at most provides connections for ten telephones. In the case of more telephones, a certain number of terminal boards 10 must be added.

A main layout rack structure employing semiconductor techniques has been developed to replace the above structure. Such improved layout rack has smaller volume. However, the expense for such semiconductor techniques is over twenty times the cost for the conventional layout rack. Therefore, rack structures employing semiconductor techniques are not widely used.

The above conventional layout rack structure has the following shortcomings:

1. Each terminal board 10 is applicable to ten lines (that is, ten telephones). Therefore, in the case of one hundred telephones, ten terminal boards will be necessary for providing connections for the one hundred telephones. As a result, the volume will increase ten times and much room will be occupied.
2. When connecting each telephone, one set of two lines must be connected to one set of incoming line engaging troughs 11 of the terminal board 10 from the exchange and then one set of two lines must be engaged with the corresponding outgoing line engaging troughs 12 and connected to the telephone. Such procedure is troublesome and inconvenient and the more telephones there are, the more complicated the lines are.

SUMMARY OF THE INVENTION

It is therefore a primary object of the present invention to provide an improved communication main layout rack structure in which two thin panel-like PC boards are assembled into one unit for connection of numerous telephones. When each other unit is added, more telephones can be connected. The volume of the layout rack is small and will not occupy much room.

It is a further object of the present invention to provide the above main layout rack structure in which the connection is simplified in such a manner connectors are directly inserted into and connected with the exchange and the telephones. Therefore, there is no need to lay tens or hundreds of random lines in the box of the main layout rack. As a result, the appearance is tidy and it is easy to install and maintain the unit.

The present invention can be best understood through the following description and accompanying drawings wherein:

DETAILED DESCRIPTION OF THE PREFERRED EMBODIMENTS

Figure 1:
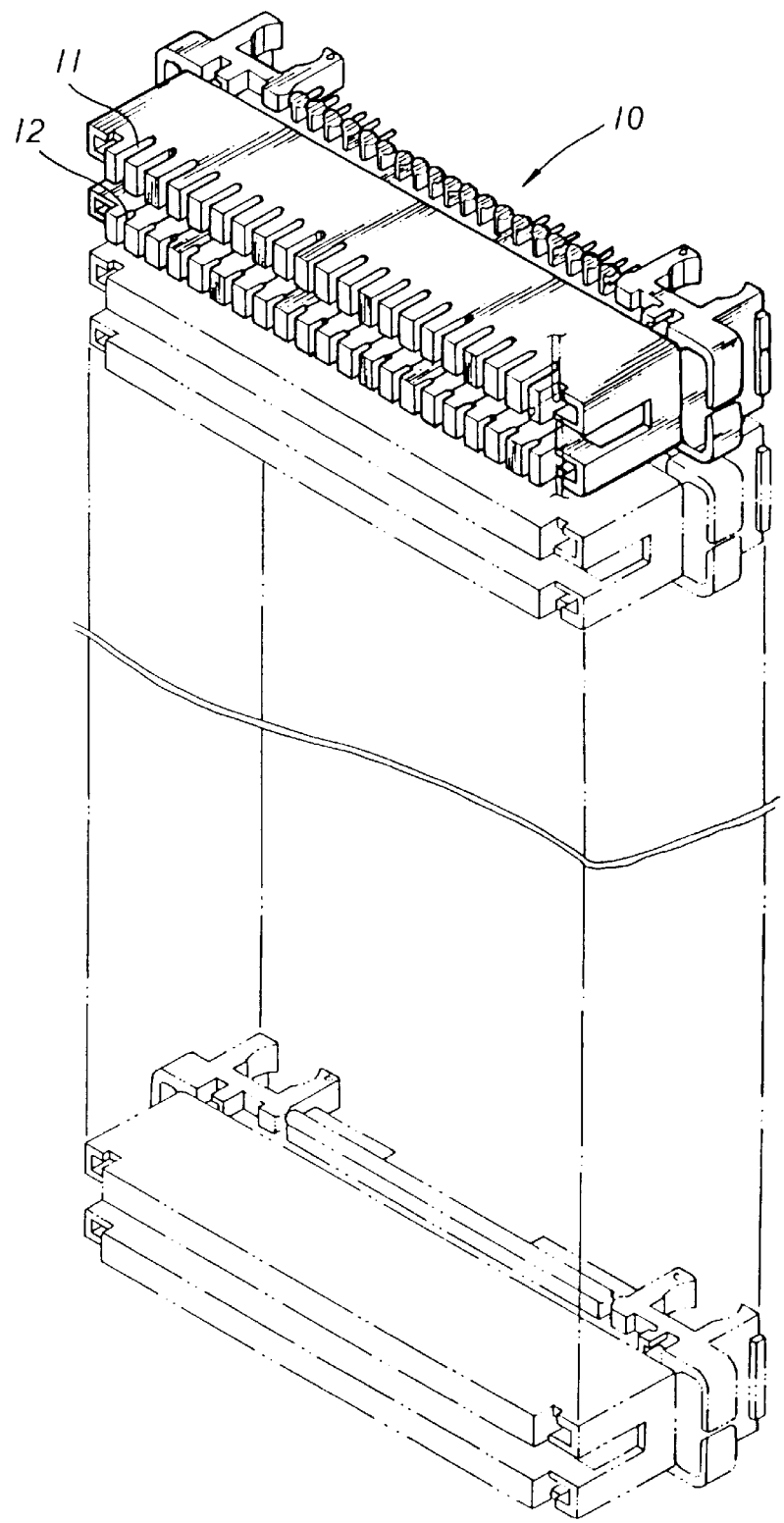
FIG. 1 is a perspective view of a structure of multiple conventional communication main layout racks overlaid on each other.
Figure 2:
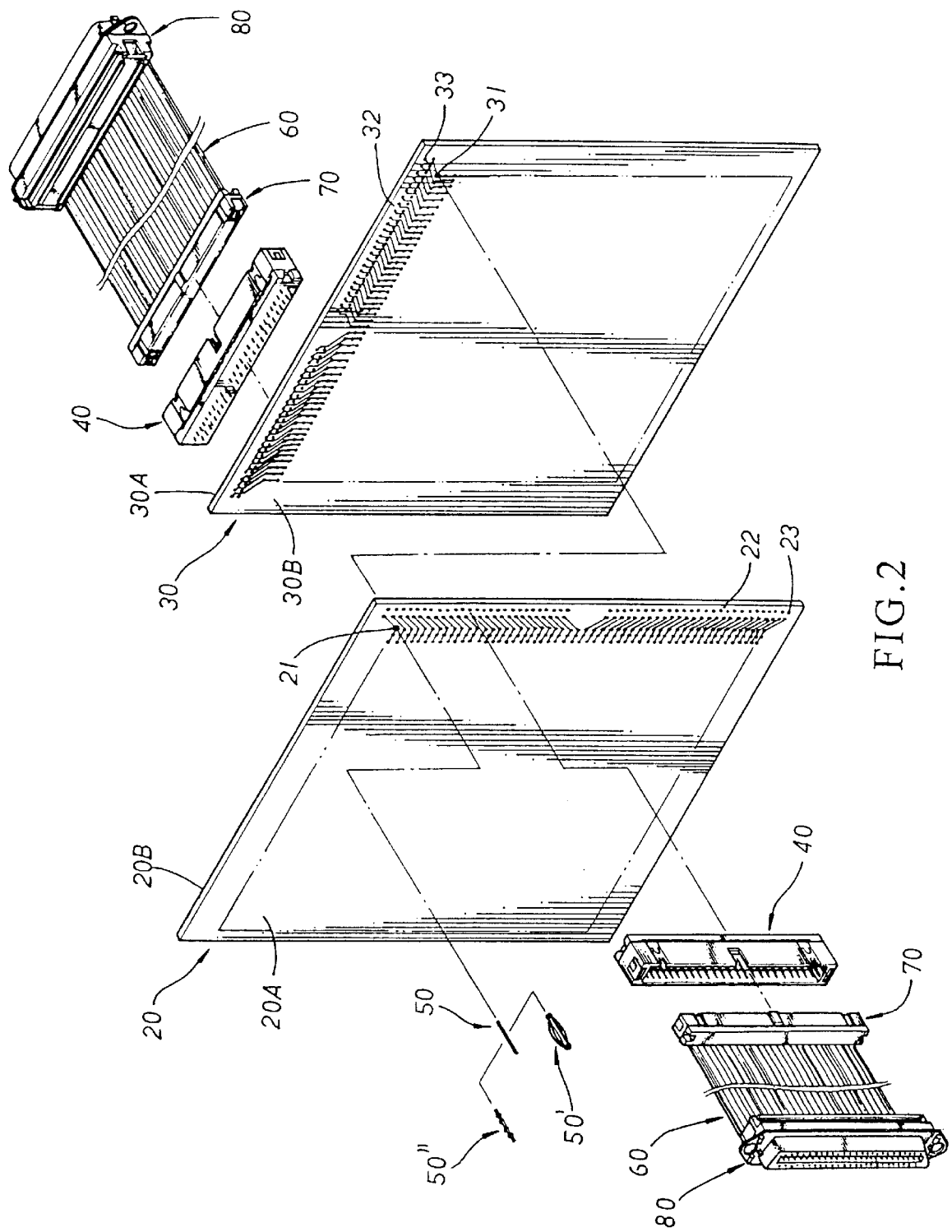
FIG. 2 is a perspective exploded view of the present invention.
Figure 3:
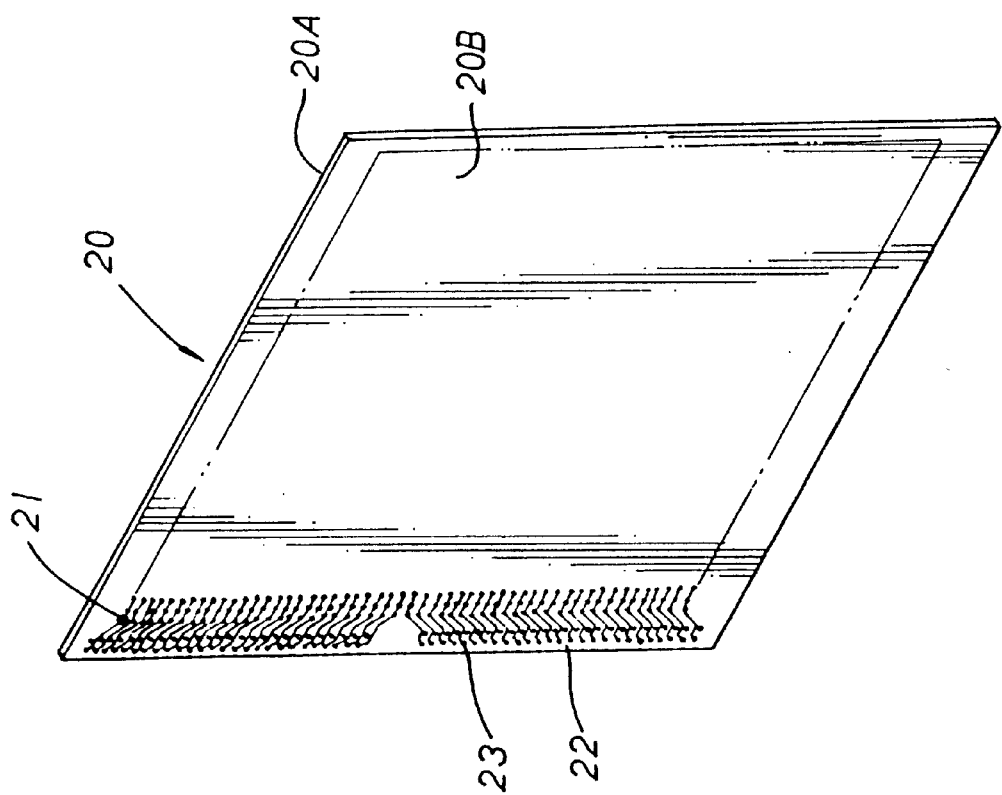
FIG. 3 is a perspective view showing the back face of the first PC board of the present invention.
Figure 4:
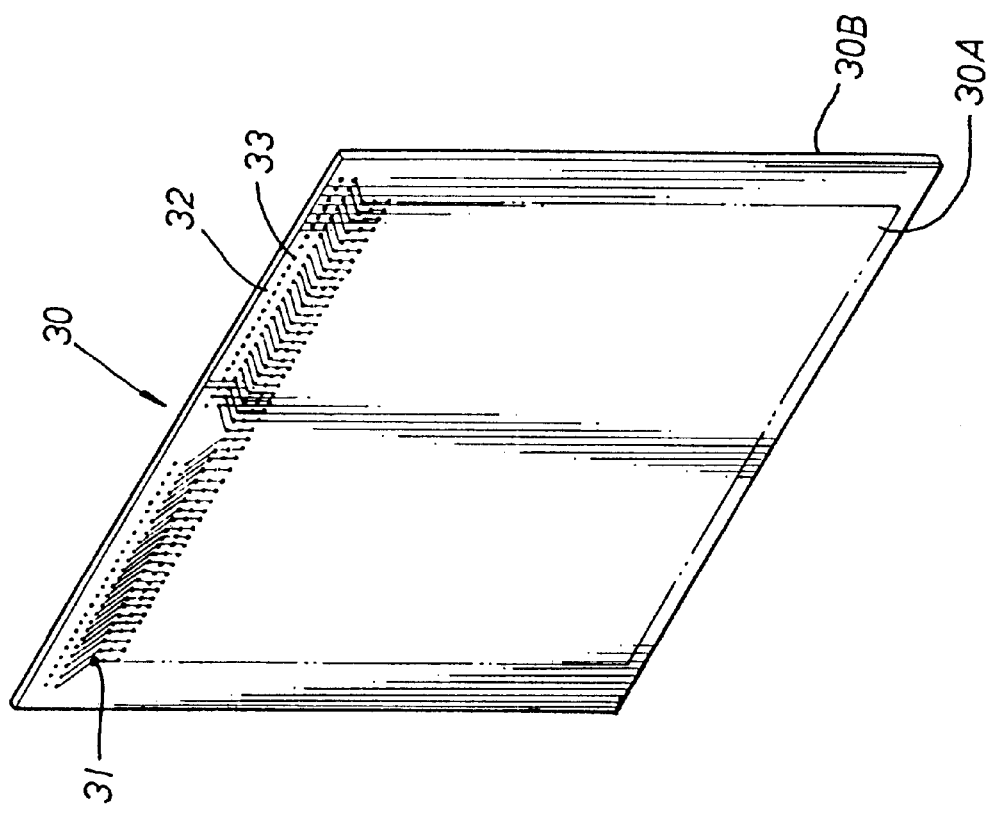
FIG. 4 is a perspective view showing the front face of the second PC board of the present invention.
Figure 5:
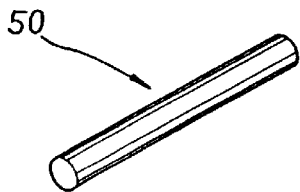
FIG. 5 is an enlarged perspective view of the insertion pin of the present invention.

Please refer to FIG. 2. The present invention includes a first PC board 20, a second PC board 30, four insertion seats 40, fifty pairs of insertion pins 50, four bus lines 60, four mating insertion seats 70 connected to one end of the bus line 60 and four connectors 80 connected to the other end of the bus line 60. The central portion of the first PC board 20 is formed with 2500 copper-plated insertion holes 21 arranged into a square pattern at equal intervals (50×50 array ). In addition, the upper and lower sections of one side of the first PC board 20 are formed with two rows of 25 pairs of copper-plated soldering holes 23 forming an insertion seat soldering section 22. The holes in the uppermost row of copper-plated insertion holes 21 of the front face 20A of the first PC board 20 are electrically connected with each other and electrically connected with the first copper-plated soldering hole 23 on the inner side of the insertion seat soldering section 22 of the upper section counted from the upper side. The holes in the second uppermost row of copper-plated insertion holes 21 of the front face 20A of the first PC board 20 are electrically connected with each other and electrically connected with the second copper-plated soldering hole 23 on the inner side of the insertion seat soldering section 22 of the upper section counted from upper side. The above arrangement is repeated until the holes in the last row of copper-plated insertion holes 21 of the front face 20A of the first PC board 20 are electrically connected with each other and electrically connected with the lowermost copper-plated soldering hole 23 on the inner side of the insertion seat soldering section 22 of the lower section. In addition, the holes in the uppermost row of copper-plated insertion holes 21 of the back face 20B of the first PC board 20 are electrically connected with each other (as shown in FIG. 3) and electrically connected with the first copper-plated soldering hole 23 on the outer side of the insertion seat soldering section 22 of the upper section counted from the upper side. The holes in the second uppermost row of copper-plated insertion holes 21 of the back face 20B of the first PC board 20 are electrically connected with each other and electrically connected with the second copper-plated soldering hole 23 on the outer side of the insertion seat soldering section 22 of the upper section counted from the upper side. The above arrangement is repeated until the holes in the last row of copper-plated insertion holes 21 of the back face 20B of the first PC board 20 are electrically connected with each other and electrically connected with the lowermost copper-plated soldering hole 23 on the outer side of the insertion seat soldering section 22 of the lower section. The central portion of the second PC board 30 is formed with 2500 copper-plated insertion holes 31 arranged into a square pattern at equal intervals (50×50 array). In addition, the front and rear sections of the upper side of the second PC board 30 are formed with two rows of 25 pairs of copper-plated soldering holes 33 forming an insertion seat soldering section 32. The holes in the most forward row of copper-plated insertion holes 31 of the front face 30A of the second PC board 30 are electrically connected with each other (as shown in FIG. 4) and electrically connected with the first copper-plated soldering hole 33 on the lower side of the insertion seat soldering section 32 of the front section counted from the front side. The holes in the second most forward row of copper-plated insertion holes 31 of the front face 30A of the second PC board 30 are electrically connected with each other and electrically connected with the second copper-plated soldering hole 33 on the lower side of the insertion seat soldering section 32 of the front section counted from the front side. The above arrangement is repeated until the holes in the last row of copper-plated insertion holes 31 of the front face 30A of the second PC board 30 are electrically connected with each other and electrically connected with the last copper-plated soldering hole 33 on the lower side of the insertion seat soldering section 32 of the rear section. The holes in the most forward row of copper-plated insertion holes 31 of the back face 30B of the second PC board 30 are electrically connected with each other and electrically connected with the first copper-plated soldering hole 33 on the upper side of the insertion seat soldering section 32 of the front section counted from front side. The holes in the second most forward row of copper-plated insertion holes 31 of the back face 30B of the second PC board 30 are electrically connected with each other and electrically connected with the second copper-plated soldering hole 33 on the upper side of the insertion seat soldering section 32 of the front section counted from the front side. The above arrangement is repeated until the holes in the last row of copper-plated insertion holes 31 of the back face 30B of the second PC board 30 are electrically connected with each other and electrically connected with the last copper-plated soldering hole 33 on the upper side of the insertion seat soldering section 32 of the rear section. Referring to FIG. 5, the insertion pin 50 is a cylindrical member made of highly conductive metal with a certain length. The insertion pin 50 has such an outer diameter as to snugly fit into the copper-plated insertion hole 21 of the first PC board 20 and the copper-plated insertion hole 31 of the second PC board 30. The four mating insertion seats 70 are respectively connected with one end of the bus lines 60, while the four connectors 80 are respectively connected with the other end of the bus line 60.

Figure 6:
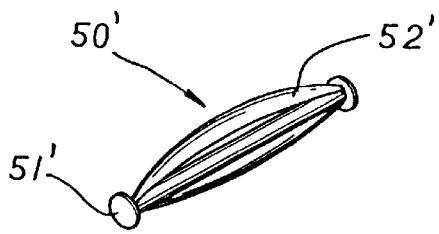
FIG. 6 is an enlarged perspective view of another embodiment of the insertion pin of the present invention.

FIG. 6 shows another embodiment of the insertion pin 50' of the present invention. The insertion pin 50' is made of highly conductive metal. Two ends of the insertion pin 50' are formed with circular enlarged head sections 51' having such an outer diameter as to snugly fit into the copper-plated insertion hole 21 of the first PC board 20 and the copper-plated insertion hole 31 of the second PC board 30. Two sides of the middle slender section of the insertion pin 50' are formed with symmetrical arch resilient plates 52' made of highly conductive metal and having a diameter larger than the outer diameter of the head sections.

Figure 7:
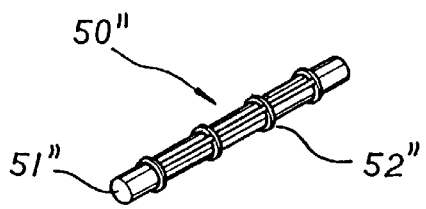
FIG. 7 is an enlarged perspective view of still another embodiment of the insertion pin of the present invention.

FIG. 7 shows still another embodiment of the insertion pin 50" of the present invention. The insertion pin 50" has an insertion post 51" smaller than the copper-plated insertion holes 21, 31 and made of the same material as the PC board. Conductive skin 52" is fitted around the insertion post 51'. The conductive skin 52' is made of well highly conductive metal and equal in diameter to the diameter of the copper-plated insertion holes 21, 31.

Figure 9:
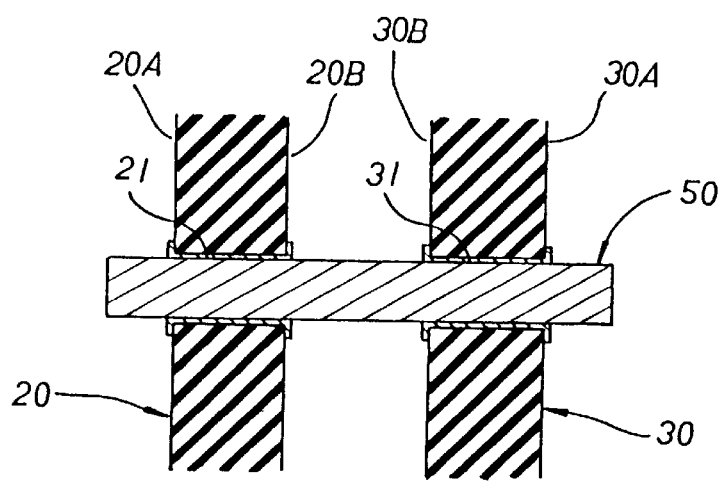
FIG. 9 is a sectional assembled view of a part of the present invention.
Figure 8:
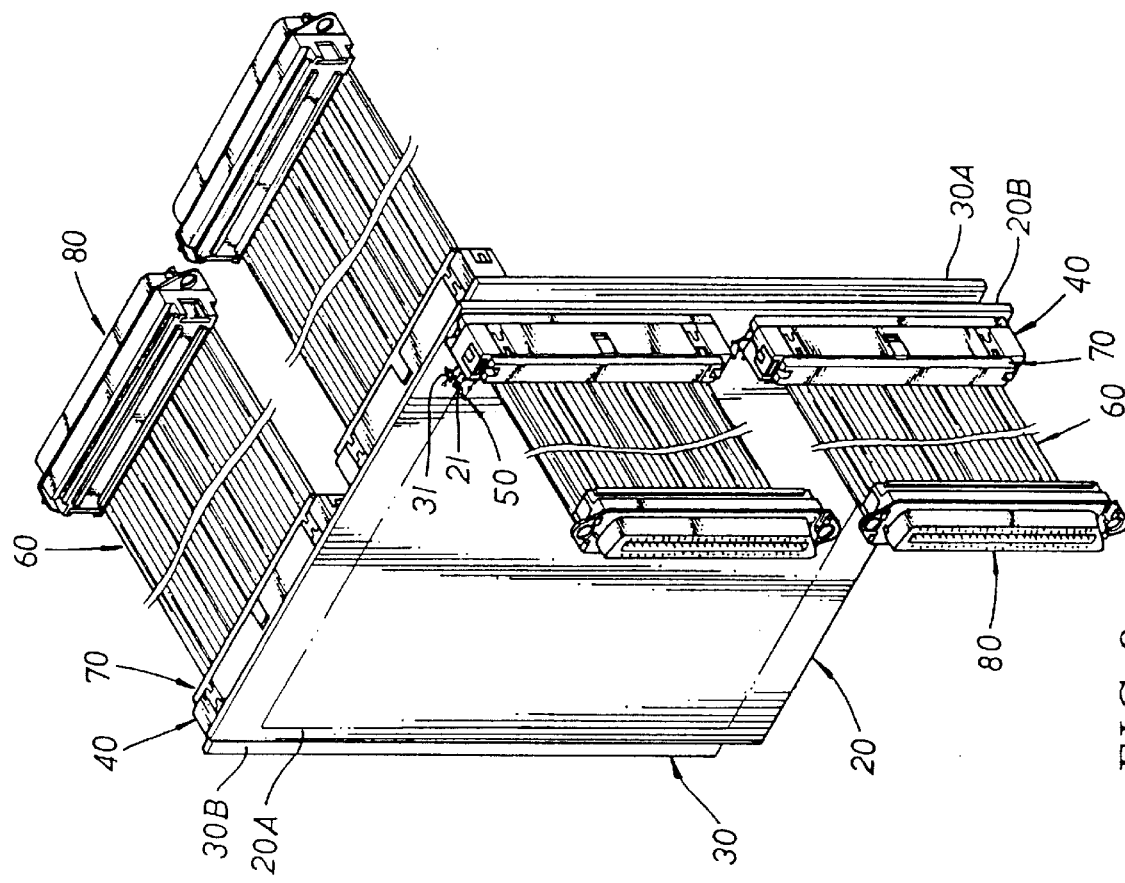
FIG. 8 is a perspective assembled view of the present invention.

When assembled, as shown in FIG. 8, one end of the fifty pairs of insertion pins 50 is inserted into the copper-plated insertion hole 21 of the first PC board 20, while the other end thereof is inserted into the corresponding copper-plated insertion hole 31 of the second PC board 30 (referring to FIG. 9). The selection of effective copper-plated insertion hole 21, 31 is made in accordance with a calculation. Then the ends of the four bus lines 60 with the mating insertion seats 70 are inserted into the four insertion seats 40 to complete the assembly to be used on a main layout rack for fifty telephones. The connectors 80 connected with the other end of the bus lines 60 inserted in the insertion seats 40 of the first PC board 20 are directly inserted into and connected with an exchange. The connectors 80 connected with the other end of the bus lines 60 inserted in the insertion seats 40 of the second PC board 30 are connected with the telephone. The first and second PC boards can be exchanged. In the case that fifty telephones are added, another unit can be added.

The number of the copper-plated insertion holes 21, 31 of the first and second PC boards 20, 30 can be other than 2500 arranged as 50×50 array. Other number of insertion holes can be arranged into a square array.

According to the above arrangement, the present invention has the following advantages:

What is claimed is:

1. Communication main layout rack structure comprising a first PC board, a second PC board, several insertion seats, several pairs of insertion pins, several bus lines, several mating insertion seats and several connectors, a central portion of the first PC board being formed with multiple copper-plated insertion holes arranged into a square pattern, an upper section and a lower section of one side edge of the first PC board being respectively formed with an insertion seat soldering section, a central portion of the second PC board being formed with multiple copper-plated insertion holes arranged into a square pattern, a front section and a rear section of an upper side edge of the second PC board being respectively formed with an insertion seat soldering section, the insertion seats being soldered on the insertion seat soldering sections of the front faces of the first and second PC boards, the mating insertion seats being respectively connected with one end of the bus lines and inserted in the insertion seats, the connectors being connected with the other end of the bus lines, wherein the connectors connected with one of the PC boards are inserted into an exchange and the connectors connected with the other of the PC boards are connected with telephones to form a main layout rack with small volume.

2. Communication main layout rack structure as claimed in claim 1, wherein the upper section and the lower section of said one side edge of the first PC board is respectively formed with at least one pair of copper-plated soldering holes forming the insertion seat soldering section, each row of copper-plated insertion holes of the front face of the first PC board being electrically connected with each other and with a corresponding copper-plated soldering hole on an inner side of the insertion seat soldering section, each row of copper-plated insertion holes of the back face of the first PC board being electrically connected with each other and with a corresponding copper-plated soldering hole on an outer side of the insertion seat soldering section.

3. Communication main layout rack structure as claimed in claim 1, wherein the front section and the rear section of the upper side edge of the second PC board is respectively formed with at least one pair of copper-plated soldering holes forming the insertion seat soldering section, each row of copper-plated insertion holes of the front face of the second PC board being electrically connected with each other and with a corresponding copper-plated soldering hole on a lower side of the insertion seat soldering section, each row of copper-plated insertion holes of the back face of the second PC board being electrically connected with each other and with a corresponding copper-plated soldering hole on an upper side of the insertion seat soldering section.

4. Communication main layout rack structure as claimed in claim 1, wherein the insertion pin is a cylindrical member made of conductive metal with a certain length, the insertion pin having such an outer diameter as to snugly fit into the copper-plated insertion holes of the PC boards.

5. Communication main layout rack structure as claimed in claim 4, wherein the insertion pin is made of conductive metal, two ends of the insertion pin being formed with circular enlarged head sections having such an outer diameter as to snugly fit into the copper-plated insertion holes of the PC boards, two sides of a middle slender section of the insertion pin being respectively formed with two symmetrical arch resilient plates made of conductive metal and having a diameter larger than an outer diameter of the head section.

6. Communication main layout rack structure as claimed in claim 4, wherein the insertion pin has an insertion post smaller than the copper-plated insertion holes and made of the same material as the PC boards, and further comprising a conductive skin being fitted around the insertion post, the conductive skin being made of conductive metal and having a diameter equal to the diameter of the copper-plated insertion holes.

* * * * *